(12) United States Patent
Whitefield et al.

(10) Patent No.: US 7,598,127 B2
(45) Date of Patent: Oct. 6, 2009

(54) NANOTUBE FUSE STRUCTURE

(75) Inventors: Bruce J. Whitefield, Camas, WA (US); Derryl D. J. Allman, Camas, WA (US); Thomas Rueckes, Rockport, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 76 days.

(21) Appl. No.: 11/284,503

(22) Filed: Nov. 22, 2005

(65) Prior Publication Data
US 2006/0258122 A1 Nov. 16, 2006

Related U.S. Application Data

(60) Provisional application No. 60/680,901, filed on May 12, 2005.

(51) Int. Cl.
*H01L 21/86* (2006.01)
(52) U.S. Cl. .................. 438/132; 977/742; 327/525; 365/96
(58) Field of Classification Search ............. 438/130, 438/132; 327/525; 977/742; 365/96
See application file for complete search history.

(56) References Cited

U.S. PATENT DOCUMENTS

| | | | |
|---|---|---|---|
| 1,407,785 A * | 2/1922 | Cole | ............... 337/239 |
| 6,057,637 A | 5/2000 | Zettl et al. | |
| 6,277,318 B1 | 8/2001 | Bower et al. | |
| 6,342,276 B1 | 1/2002 | You et al. | |
| 6,409,567 B1 | 6/2002 | Amey, Jr. et al. | |
| 6,422,450 B1 | 7/2002 | Zhou et al. | |
| 6,423,583 B1 | 7/2002 | Avouris et al. | |
| 6,495,116 B1 | 12/2002 | Herman | |

(Continued)

FOREIGN PATENT DOCUMENTS

GB          2 364 933 A          2/2002

(Continued)

OTHER PUBLICATIONS

U.S. Appl. No. 10/341,005, filed Jan. 23, 2003, Ward et al.

(Continued)

*Primary Examiner*—W. David Coleman
(74) *Attorney, Agent, or Firm*—Wilmer Cutler Pickering Hale and Dorr LLP

(57) ABSTRACT

A method of forming a carbon nanotube fuse by depositing a carbon nanotube layer, then depositing a cap layer directly over the carbon nanotube layer. The cap layer is formed of a material that has an insufficient amount of oxygen to significantly oxidize the carbon nanotube layer under operating conditions, and is otherwise sufficiently robust to protect the carbon nanotube layer from oxygen and plasmas. A photoresist layer is formed over the cap layer, and the photoresist layer is patterned to define a desired size of fuse. Both the cap layer and the carbon nanotube layer are completely etched, without removing the photoresist layer, to define the fuse having two ends in the carbon nanotube layer. Just the cap layer is etched, without removing the photoresist layer, so as to reduce the cap layer by a desired amount at the edges of the cap layer under the photoresist layer, without damaging the carbon nanotube layer. The photoresist layer is removed, and electrically conductive contacts are formed on each of the two ends of the fuse.

3 Claims, 7 Drawing Sheets

U.S. PATENT DOCUMENTS

| | | |
|---|---|---|
| 6,495,258 B1 | 12/2002 | Chen et al. |
| 6,515,339 B2 | 2/2003 | Shin et al. |
| 6,528,020 B1 | 3/2003 | Dai et al. |
| 6,574,130 B2 | 6/2003 | Segal et al. ................ 365/129 |
| 6,630,772 B1 | 10/2003 | Bower et al. |
| 6,643,165 B2 | 11/2003 | Segal et al. ................ 365/151 |
| 6,645,628 B2 | 11/2003 | Shiffler, Jr. et al. |
| 6,706,402 B2 | 3/2004 | Rueckes et al. ............ 428/408 |
| 6,707,098 B2 | 3/2004 | Hofmann et al. |
| 6,784,028 B2 | 8/2004 | Reuckes et al. ............ 438/128 |
| 6,808,746 B1 | 10/2004 | Dai et al. |
| 6,833,558 B2 | 12/2004 | Lee et al. |
| 6,835,591 B2 | 12/2004 | Rueckes et al. .............. 438/99 |
| 6,836,424 B2 | 12/2004 | Segal et al. ................ 365/129 |
| 6,858,197 B1 | 2/2005 | Delzeit |
| 6,863,942 B2 | 3/2005 | Ren et al. |
| 6,894,359 B2 | 5/2005 | Bradley et al. |
| 6,899,945 B2 | 5/2005 | Smalley et al. |
| 6,911,682 B2 | 6/2005 | Reuckes et al. ............ 257/202 |
| 6,918,284 B2 | 7/2005 | Snow et al. |
| 6,919,592 B2 | 7/2005 | Segal et al. ................ 257/209 |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,944,054 B2 | 9/2005 | Rueckes et al. ............ 365/177 |
| 6,946,410 B2 | 9/2005 | French et al. |
| 6,990,009 B2 | 1/2006 | Bertin et al. |
| 6,995,046 B2 | 2/2006 | Rueckes et al. |
| 7,015,500 B2 | 3/2006 | Choi et al. |
| 7,057,402 B2 | 6/2006 | Cole et al. |
| 7,161,218 B2 * | 1/2007 | Bertin et al. ................ 257/415 |
| 7,161,403 B2 | 1/2007 | Bertin |
| 7,329,931 B2 | 2/2008 | Bertin |
| 7,339,401 B2 | 3/2008 | Bertin et al. |
| 7,416,993 B2 | 8/2008 | Segal et al. |
| 2001/0004979 A1 | 6/2001 | Han et al. |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2005/0047244 A1 * | 3/2005 | Rueckes et al. ............ 365/222 |
| 2005/0052894 A1 * | 3/2005 | Segal et al. ................ 365/129 |
| 2005/0053525 A1 * | 3/2005 | Segal et al. .................. 422/88 |
| 2005/0056825 A1 * | 3/2005 | Bertin et al. .................. 257/20 |
| 2005/0056866 A1 * | 3/2005 | Bertin et al. ................ 257/213 |
| 2005/0056877 A1 * | 3/2005 | Rueckes et al. ............ 257/300 |
| 2005/0058590 A1 * | 3/2005 | Sen et al. ................ 423/447.1 |
| 2005/0058797 A1 * | 3/2005 | Sen et al. ................ 428/36.91 |
| 2005/0058834 A1 * | 3/2005 | Rueckes et al. ............ 428/408 |
| 2005/0059176 A1 * | 3/2005 | Rueckes et al. ............ 438/20 |
| 2005/0059210 A1 * | 3/2005 | Rueckes et al. ............ 438/257 |
| 2005/0062035 A1 * | 3/2005 | Bertin et al. .................. 257/20 |
| 2005/0062062 A1 * | 3/2005 | Bertin et al. ................ 257/200 |
| 2005/0062070 A1 * | 3/2005 | Bertin et al. ................ 257/213 |
| 2005/0063210 A1 * | 3/2005 | Segal et al. ................ 365/103 |
| 2005/0063244 A1 * | 3/2005 | Bertin et al. ................ 365/232 |
| 2005/0065741 A1 * | 3/2005 | Segal et al. .................... 702/57 |
| 2005/0074926 A1 * | 4/2005 | Bertin et al. ................ 438/129 |
| 2005/0095938 A1 | 5/2005 | Rosenberger et al. |
| 2005/0101112 A1 * | 5/2005 | Rueckes et al. ............. 438/584 |
| 2005/0128788 A1 * | 6/2005 | Segal et al. .................. 365/151 |
| 2005/0174842 A1 * | 8/2005 | Bertin et al. ........... 365/185.03 |
| 2005/0191495 A1 * | 9/2005 | Rueckes et al. ............. 428/408 |
| 2005/0237781 A1 * | 10/2005 | Bertin et al. ................. 365/145 |
| 2005/0269553 A1 * | 12/2005 | Sen et al. ..................... 252/500 |
| 2005/0269554 A1 * | 12/2005 | Sen et al. ..................... 252/500 |
| 2005/0282516 A1 * | 12/2005 | Bertin ....................... 455/335 |
| 2006/0044035 A1 * | 3/2006 | Bertin ....................... 327/202 |
| 2006/0061389 A1 * | 3/2006 | Bertin ....................... 326/104 |
| 2006/0125033 A1 * | 6/2006 | Segal et al. ................. 257/415 |
| 2006/0128049 A1 * | 6/2006 | Jaiprakash et al. ............ 438/53 |
| 2006/0183278 A1 * | 8/2006 | Bertin et al. ................. 438/197 |
| 2006/0193093 A1 * | 8/2006 | Bertin et al. .................. 361/56 |
| 2006/0204427 A1 * | 9/2006 | Ghenciu et al. .......... 423/445 B |
| 2006/0231865 A1 * | 10/2006 | Rueckes et al. ............. 257/209 |
| 2006/0237805 A1 * | 10/2006 | Segal et al. ................. 257/414 |
| 2006/0250843 A1 * | 11/2006 | Bertin et al. ........... 365/185.08 |
| 2006/0250856 A1 * | 11/2006 | Bertin et al. ........... 365/189.01 |
| 2006/0255834 A1 * | 11/2006 | Bertin .......................... 326/56 |
| 2006/0258122 A1 | 11/2006 | Whitefield et al. |
| 2006/0264053 A1 | 11/2006 | Yates |
| 2006/0276056 A1 * | 12/2006 | Ward et al. ................... 438/800 |
| 2006/0281256 A1 | 12/2006 | Carter et al. |
| 2006/0281287 A1 | 12/2006 | Yates et al. |
| 2006/0292716 A1 | 12/2006 | Gu et al. |
| 2007/0004191 A1 | 1/2007 | Gu et al. |
| 2007/0018260 A1 * | 1/2007 | Jaiprakash et al. .......... 257/414 |
| 2007/0030721 A1 * | 2/2007 | Segal et al. ................. 365/153 |
| 2007/0063740 A1 * | 3/2007 | Bertin et al. ................. 326/104 |
| 2007/0108482 A1 * | 5/2007 | Bertin et al. ................. 257/288 |
| 2008/0012047 A1 | 1/2008 | Bertin et al. |
| 2008/0142850 A1 | 6/2008 | Bertin et al. |
| 2008/0157126 A1 | 7/2008 | Bertin et al. |
| 2008/0159042 A1 | 7/2008 | Bertin et al. |
| 2008/0186756 A1 | 8/2008 | Bertin et al. |
| 2008/0191742 A1 | 8/2008 | Bertin |
| 2008/0231413 A1 | 9/2008 | Bertin et al. |
| 2008/0251723 A1 | 10/2008 | Ward et al. |

FOREIGN PATENT DOCUMENTS

| | | |
|---|---|---|
| JP | 2000-203821 | 7/2000 |
| JP | 2001-035362 A2 | 2/2001 |
| JP | 2004-090208 | 3/2004 |
| WO | WO-98/39250 A1 | 9/1998 |
| WO | WO-99/65821 A1 | 12/1999 |
| WO | WO-01/03208 A1 | 1/2001 |
| WO | WO-00/245113 A2 | 6/2002 |
| WO | WO-00/248701 A2 | 6/2002 |
| WO | WO-03/016901 A1 | 2/2003 |
| WO | WO-03/034142 A1 | 4/2003 |

OTHER PUBLICATIONS

Avouris, P., et al., "Carbon Nanotube Electronics," *Chemical Physics*, 2002, vol. 284, pp. 429-445.

Johnson, R. Colin, "IBM fellow unrolls blueprint for nano", *EETimes*, Mar. 6, 2006, 3 pages, http://www.eetimes.com/showArticle.jhtml?articleID=181500304.

Peigney, A. et al., *J. Phys. Chem. B.*, vol. 105 (2001) pp. 9699-9710.

Collins, P. G. et al., "Engineering Carbon Nanotubes and Nanotube Circuits Using Electrical Breakdown", *Science*, vol. 292, pp. 706-709, Apr. 27, 2001.

Hone, J., "Phonons and Thermal Properties of Carbon Nanotubes", *Carbon Nanotubes, Topics Appl. Phys.*, vol. 80, pp. 273-286, 2001.

Kong, J. et al., "Quantum Interference and Ballistic Transmission in Nanotube Electron Waveguides", *The American Physical Society*, vol. 87, No. 10, pp. 106801-1 - 106801-4, Sep. 3, 2001.

Derycke, V. et al., "Controlling doping and carrier injection in carbon nanotube transistors", *Applied Physics Letters*, vol. 80, No. 15, pp. 2773-2775, Apr. 15, 2002.

Onoa et al., "Bulk Production of singly dispersed carbon nanotubes with prescriped lengths", *Nanotechnology*, vol. 16, pp. 2799-2803, 2005.

Rueckes, et al., "Carbon nanotube-based nonvolatile random access memory for molecular computing", *Science*, vol. 289, pp. 94-97, Jul. 7, 2000.

Ago et al., "Workfunction of Purified and Oxidised Carbon Nanotubes," Synthetic Metals, vol. 103, pp. 2494-2495 (1999).

Ajayan et al., "Application of Carbon Nanotubes," Carbon Nanotubes, Topics Appl. Phys. vol. 80, pp. 391-425, Springer-Verlag Berlin Heidelberg (2001).

Banerjee et al., "Functionalization of Carbon Nanotubes with a Metal-Containing Molecular Complex," Nano Letters, vol. 2, No. 1, pp. 49-53 (2002).

Berhan et al., "Mechanical properties of nanotubes sheets: Alterations in joint morphology and achievable moduli in manufacturable materials," Journal of applied Physics, vol. 95, No. 8, pp. 4335-4345 (Apr. 15, 2004).

Chiang et al., "Purification and Charactirization of Single-Wall Carbon Nanotubes,", *J. Phys. Chem B.*, vol. 105, pp. 1157-1161 (2001).

Delzeit et al., "Multilayered metal catalysts for controlling the density of single-walled carbon nanotubes growth," Chemical Physics letters, vol. 348, pp. 368-374, Nov. 16, 2001.

Desai et al., "Frestanding Carbon Nanotube Specimen Fabrication," Proc. Of 2005, 5th IEEE Conf. nanotech, Nagoya, Japan, Jul. 2005, pp. 1-4.

Haddon et al., "Purification and Separation of Carbon Nanotubes," *MRS Bulletin*, pp. 252-259, Apr. 2004.

Hafner et al., "Catalytic growth of single-wall carbon nanotubes from metal particles," Chemical Physics Letters, vol. 296, pp. 195-202 (1998).

International Search Report and Written Opinion for International Patent Application PCT/US05/18467, mailed Oct. 1, 2007.

International Search Report, International Searching Authority, for International Application PCT/US05/18539, mailed Sep. 18, 2006, 4 pages.

Jeong et al., "A new purification method of single-wall carbon nanotubes using H2S and O2 mixture gas," Chemical Physics Letters, vol. 344, pp. 18-22, Aug. 17, 2001.

Khan et al, "Solubilization of Oxidized Single-Walled Carbon Nanotubes in Organic and aqueous Solvents through Organic Derivation," Nano Letters, vol. 2, No. 11, pp. 1215-1218 (2002).

Kong et al., "Chemical vapor deposition of methane for single-walled carbon nanotubes," Chemical Physics Letters, vol. 292, pp. 567-574 (1998).

Kong et al., "Nanotube Molecular Wires as Chemical Sensors," Science, vol. 287, pp. 622-625, Jan. 28, 2000.

Parikh, et al., "Flexible vapour sensors using single walled carbon nanotubes", Elsevier, Sensors and Actuators, B 113, pp. 55-63, 2006.

Shelimov et al., "Purification of single-wall carbon nanotubes by ultrasonically assisted filtration," Chemical Physics Letters, vol. 282, pp. 429-434, Jan. 23, 1998.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Artchitectures, Physics, and Devices", J. Phys. Chem. B, vol. 103, pp. 1126-11255, 1999.

Franklin, N. R. et al., "An Enhanced CVD Approach to Extensive Nanotube Networks with Directionality", Advanced Materials, 5 pages, 2000.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-L91, 2002.

Joselevich, E., "Vectorial Growth of Metallic and Semiconducting Single-Wall Carbon Nanotubes", Nano Letters, Vol. 0, No. 0, A-E, 2002.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13. pp. 1008-1014, 2001.

Nerushev, O. A., et al., "Carbon nanotube films obtained by thermal chemical vapour deposition", J. Mater. Chem., vol. 11, pp. 1122-1132, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Sotiropoulou, S. et al., "Carbon nanotube array-based biosensor", Anal. Bioanal. Chem, vol. 375, pp. 103-105, 2003.

Zhang et al., "Formation of metal nanowires on suspended signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al., "Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

Valentini, L. et al., "Sensors for Sub-ppm $NO_2$ Gas Detection Based on Carbon Nanotube Thin Films," *Applied Physics Letters*, 2003, vol. 82(6), pp. 961-963.

International Search Report for PCT/US2005/045316 mailed Sep. 6, 2006, 2 pages.

\* cited by examiner

NANOTUBE FUSE STRUCTURE

This application claims priority on provisional patent application 60/680,901, filed May 5, 2005.

FIELD

This invention relates to the field of integrated circuit fabrication. More particularly, this invention relates to the formation of fuses.

BACKGROUND

Fuses are used in integrated circuits to customize their functions. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

One desired use of fuses is for circuit repair where the fuse activates redundant cells that take the place of a failed portion of the device. The fuse provides a simple and permanent way to change the circuit, and takes up very little area on the integrated circuit as compared to fully programmable approaches.

One approach for device repair would be to test the integrated circuit first to determine what portions of the device are not working. From this information the fuses that need to be blown in order to isolate the failed sections from use and activate appropriate replacement cells can be calculated. The fuses are then cut such as by using a programmable laser tool.

There are several requirements for designing, building and using fuses in integrated circuits. For example, the fuse construction must be compatible with processes being used to manufacture the integrated circuit. Also, additional processing to build the fuse must be minimized, because every additional step adds manufacturing costs and potential yield killing defects. The fuse must be able to be broken consistently with a high yield, and remain electrically open over the lifetime of the device. Similarly, unbroken fuses must maintain a reliable electrical connection over the life time of the device. Further, the process for opening the fuses must be reliable, inexpensive, and selective to the specific fuse to be opened.

These constraints tend to create a variety of problems in regard to the fabrication and use of fuses. For example, the ability to form consistent hole depths in the oxide above the fuse bank requires tighter process control to be placed on the etch and deposition steps. Additional steps are required to open the oxide above the fuse bank (Masking and Etch steps). The laser spot size sets the fuse to fuse spacing, window opening, and damage region, which tends to result in a large fuse structure. The suppression of oxide damage requires a crack arresting ring of interconnect metal surrounding the fuse bank. The large opening and damage region in the fuse bank provides an entry point for impurity diffusion into the circuit area below, which can degrade the reliability of the part.

With current methods it is difficult to meet all of these requirements at the same time. As a result, fuse integrations tend to require many compromises with respect to yield, additional processing steps, and cost. This significantly limits the usefulness of fuses to control integrated circuits.

FIG. 1 depicts a typical aluminum fuse bank structure 11, where some fuses 13 are blown using a laser pulse, and other fuses 15 are left intact. FIG. 2 depicts a cross sectional diagram of an aluminum laser fuse structure such as used in a 130 nanometer copper damascene technology to activate redundant memory cells.

Fabrication of the fuse structure depicted in FIG. 2 requires an additional masking and etch step, and a more complicated stack of passivation layers. In order to avoid additional metal deposition and masking steps, the aluminum fuse must be made from the same aluminum material and thickness as the bonding pad. As a result, the fuse yield is low, which limits the number of fuses that can be used on an integrated circuit before the yield losses become unacceptable. The long term reliability of the aluminum fuse is also an issue. It is well known that aluminum materials migrate under physical or electrical stress. Fuses have been known to reconnect over time if the fuse gap is small.

Another issue with the laser blown aluminum fuse is that the yield and reliability are dependent on many factors that can vary during manufacturing. This includes the thickness and width of the aluminum fuse link, the thickness of the oxide remaining over the fuse, and the laser power that is applied to open the fuse.

A further drawback of the aluminum fuse is that it takes a relatively considerable amount of energy to break it. As a result, the passivation layer above the fuses tends to be damaged, which can affect the reliability of neighboring fuses that are not intended to be broken. In addition, any electrical interconnect or transistor in the area below the broken fuse can be damaged by the breaking process, which means that area cannot be used for other electronic elements, and becomes wasted space in the integrated circuit design.

Thus, for some of the reasons described above, current electrical fuse technology is not widely accepted as a means of circuit or memory repair. One concern with the use of fuse technology for circuit repair is the stability of the fuse structure in regard to varying temperature, electrical, and radiation conditions over time. Another concern is the generally-unknown length of time that the fuse structure can sustain the open or closed (0 or 1) circuit setting with which it is programmed.

Another detriment of aluminum fuse architecture is the fact that the blown fuse is not passivated after it is blown and the circuit may become reconnected due to environmental conditions (moisture or metals in the packaging material) forming the connection between the severed links. Also, under high tensile stress conditions aluminum metal migration can take place and reconnect the blown fuse links.

In FIG. 1, showing an aluminum fuse bank, an aluminum metal guard ring surrounds the fuse bank. The guard ring arrests cracking and confines damage caused during the laser trimming of the aluminum fuse. This guard ring takes up additional area, and so to minimize this effect the fuses are all contained in the same generalized area.

These drawbacks of the existing fuse processes are addressed by generally limiting the number of fuses that are used in an integrated circuit, or by using programmable circuits, which take up more space on the integrated circuit, but tend to be a more robust technology. Further, the use of programmable circuits adds considerably to design and manufacturing costs.

What is needed, therefore, is a system for programming integrated circuits that overcomes problems such as those described above, at least in part.

SUMMARY

The above and other needs are met by a method of forming a carbon nanotube fuse by depositing a carbon nanotube layer, then depositing a cap layer directly over the carbon nanotube layer. The cap layer is formed of a material that has an insufficient amount of oxygen to significantly oxidize the carbon nanotube layer under operating conditions, and is otherwise sufficiently robust to protect the carbon nanotube layer from oxygen and plasmas. A photoresist layer is formed over the cap layer, and the photoresist layer is patterned to define a desired size of fuse. Both the cap layer and the carbon nanotube layer are completely etched, without removing the photoresist layer, to define the fuse having two ends in the carbon nanotube layer. Just the cap layer is etched, without removing the photoresist layer, so as to reduce the cap layer by a desired amount at the edges of the cap layer under the photoresist layer, without damaging the carbon nanotube layer. The photoresist layer is removed, and electrically conductive contacts are formed on each of the two ends of the fuse.

The advantages of this method include fuses that can be created with fewer and less expensive process steps than prior art methods. In addition, the carbon nanotube layer can be formed very thin, so passivation planarity over the integrated circuit is preserved. Further, the carbon nanotube layer can conduct a great deal of heat, so it can melt the contacting metal layers, such as the fuse contacts, and sever the electrical continuity of the fuse structure. Once connected or disconnected, the carbon nanotube layer is very stable, in a manner that it will not reform a conductive link. The steps and materials used to form the fuse according to the methods described herein are compatible with existing integrated circuit processing equipment and integration schemas.

According to another aspect of the invention there is described a method of severing an electrically conductive fuse having a link between two contacts that are disposed on distal ends of the link, the method comprising the step of passing a current between the two contacts and through the link, where the current is sufficient to create a Joule heating effect within the link sufficient to cause at least one of the two contacts to ablate and sever electrical continuity with the end of the link, without the link structurally changing.

According to yet another aspect of the invention there is described a carbon nanotube fuse comprising a carbon nanotube layer, a cap layer formed directly over the carbon nanotube layer, where the cap layer is formed of a material that has an insufficient amount of oxygen to significantly oxidize the carbon nanotube layer under operating conditions, and is otherwise sufficiently robust to protect the carbon nanotube layer from oxygen and plasmas, the cap layer formed at a smaller size than the carbon nanotube layer, to expose a contact area at distal ends of the carbon nanotube layer, and electrically conductive contacts disposed on each of the two distal ends of the carbon nanotube layer and in electrical continuity with the carbon nanotube layer through the contact area, where the contact area is of a size sufficient for at least one of the contacts to ablate from the carbon nanotube layer upon application of a current that causes a Joule heating effect in the carbon nanotube layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Recent development of electronic grade conductive carbon nanotube materials enable an alternate approach for making fuses that is potentially cheaper and more reliable, while still being compatible with existing integrated circuit processes. This invention applies to the formation of fuses using a carbon nanotube layer that is compatible with existing integrated circuit fabrication methods. The sequence and structure for making the carbon nanotube fuses is detailed with reference to the figures.

Figure 1:
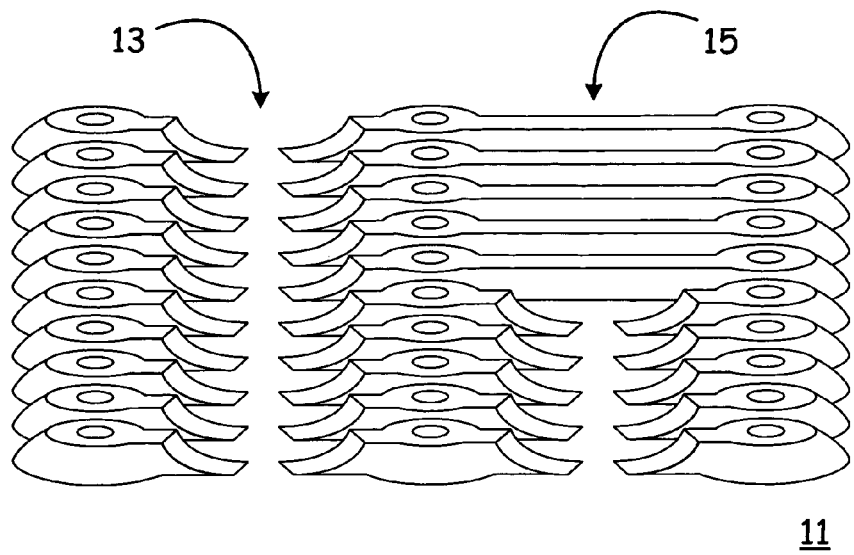
FIG. 1 is a prior art top plan view of a fuse bank.
Figure 2:
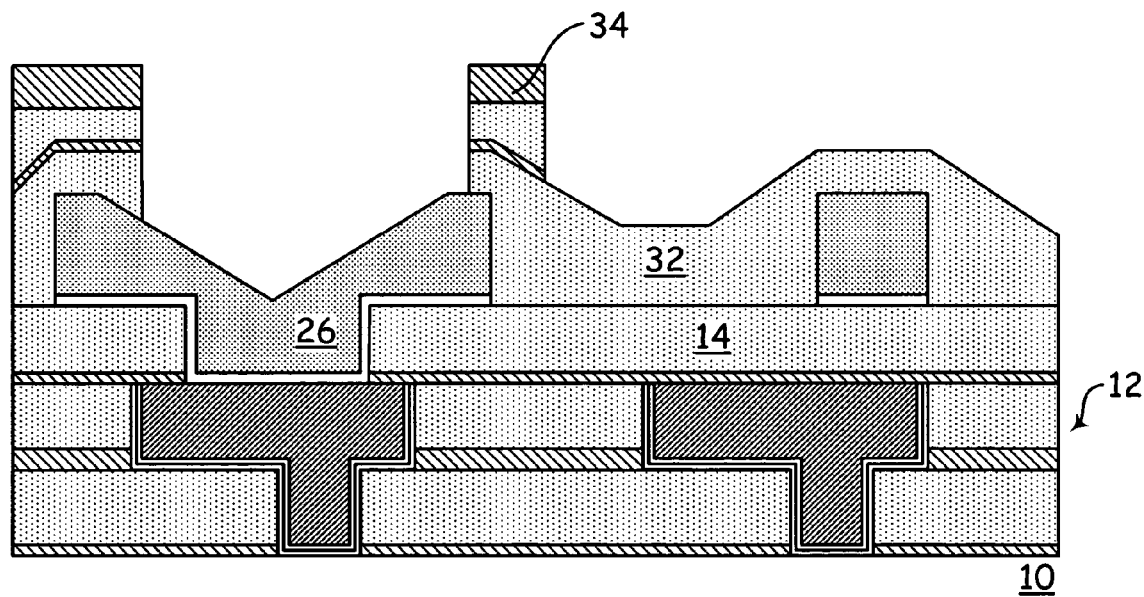
FIG. 2 is a prior art cross sectional view of a fuse structure.
Figure 3:
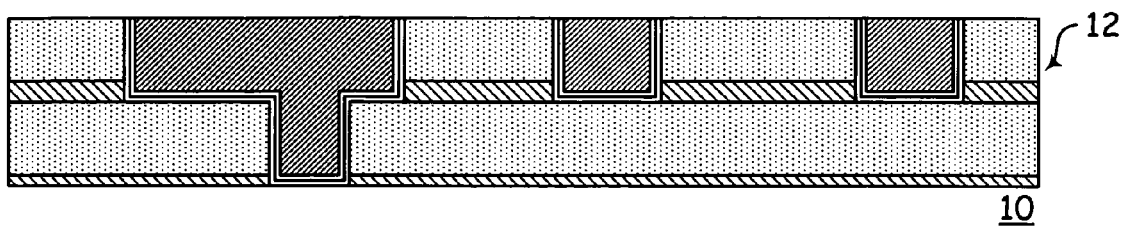
FIG. 3 is a cross sectional view of a top metal layer of an integrated circuit according to a preferred embodiment of the present invention.

FIG. 3 depicts the last or topmost interconnect layer 12 of a portion of an integrated circuit 10. The structures as generally described herein start at the layer of a standard integrated circuit before the top bonding layer is added. Common practice is for the lower layers as depicted in FIG. 3 to be made from a damascene copper interconnect pattern, and the top or bonding layer, not yet formed in FIG. 3, to be made with an aluminum alloy.

Figure 4:
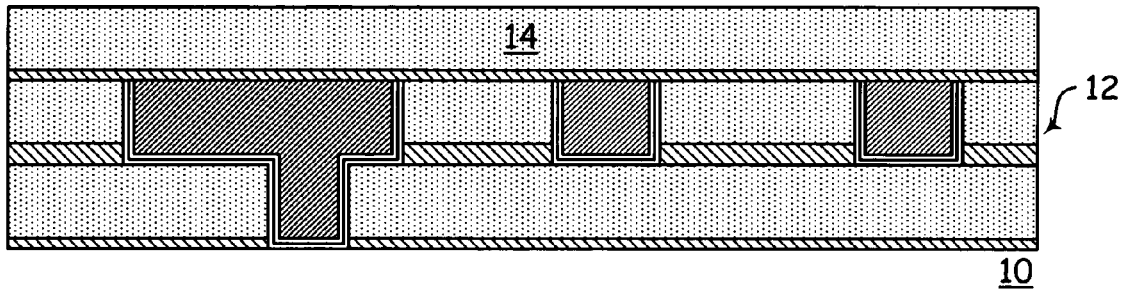
FIG. 4 is a cross sectional view of a glass layer of the integrated circuit according to the preferred embodiment of the present invention.

FIG. 4 depicts a dielectric layer 14 that has been formed on the integrated circuit 10. The dielectric layer 14 is preferably formed with standard processing as known in the art. For example, an undoped silicon glass with a silicon nitride etch stop layer underneath is commonly used, but other dielectric materials can also be used.

Figure 5:
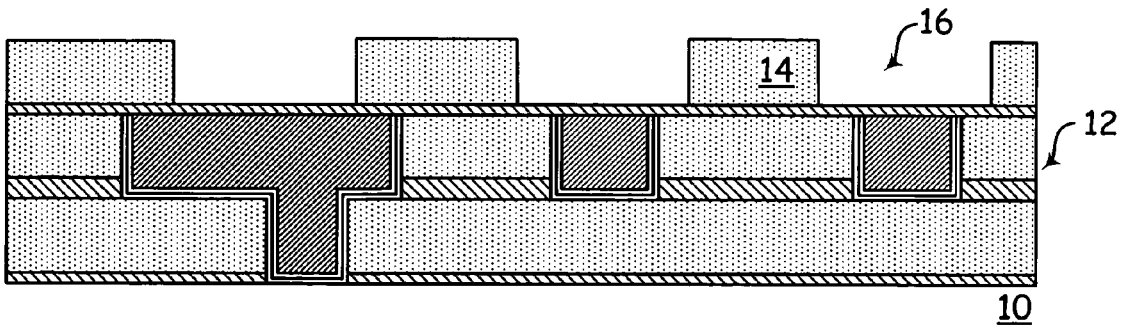
FIG. 5 is a cross sectional view of trenches etched in the glass layer of the integrated circuit according to the preferred embodiment of the present invention.
Figure 6:
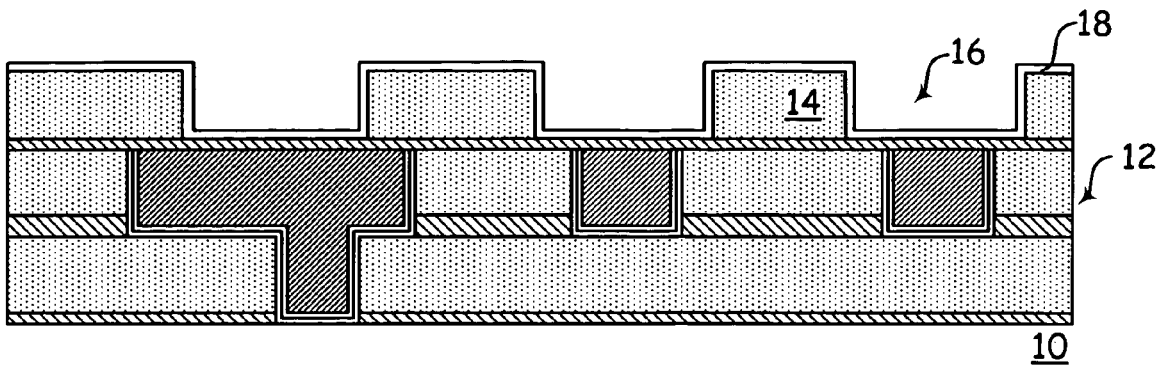
FIG. 6 is a cross sectional view of a carbon nanotube layer overlying the glass layer of the integrated circuit according to the preferred embodiment of the present invention.

In FIG. 5, the dielectric layer has been patterned and etched using standard lithographic techniques to form trenches 16. In FIG. 6, a carbon nanotube layer 18 has been formed. The carbon nanotube layer 18 is preferably formed using one or more of spin coating, dipping, or other growth or deposition techniques. In various embodiments, the carbon nanotube layer 18 can be placed on the surface prior to or after the trench 16 formation process.

Figure 7:
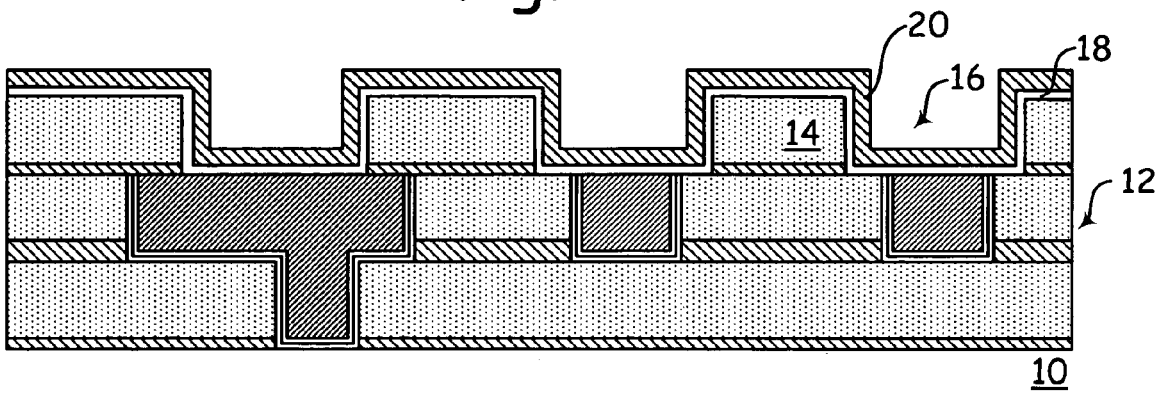
FIG. 7 is a cross sectional view of a cap layer overlying the carbon nanotube layer of the integrated circuit according to the preferred embodiment of the present invention.

A cap layer 20 is formed, as depicted in FIG. 7. The material for the cap layer 20 is preferably non electrically conductive, and will not damage the carbon nanotube layer 18 during deposition in a non-oxidizing ambient. The properties of the material by which the cap layer 20 is formed are such that it is capable of protecting the carbon nanotube layer 18 during later processing that might damage it, such as plasma depositions and etches. Non plasma deposited silicon carbide is a suitable material for the cap layer 20, but other materials such as chemical vapor deposition silicon nitride, high density plasma or atmospheric pressure chemical vapor deposition phospho-silicon glass or undoped silicon glass could be used Any insulator deposition process where oxidizing reaction compounds are kept away from the carbon nanotube layer 18 can be used.

Figure 8:
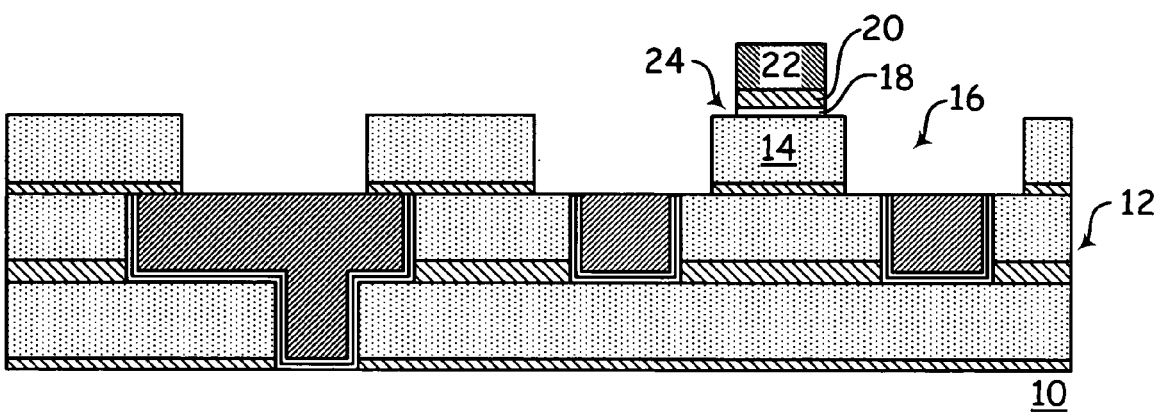
FIG. 8 is a cross sectional view of a patterned fuse structure of the integrated circuit according to the preferred embodiment of the present invention.
Figure 9:
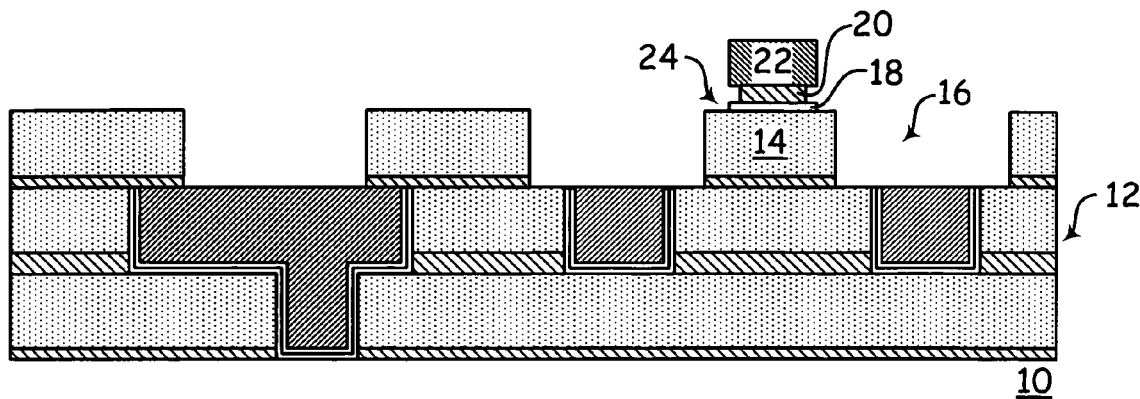
FIG. 9 is a cross sectional view of a reduced cap layer of the integrated circuit according to the preferred embodiment of the present invention.

FIG. 8 depicts a photoresist layer 22 that has been formed on the integrated circuit 10, and the carbon nanotube fuse 24 has been etched. Before the photoresist 22 is removed, the cap layer 20 is preferably etched, as depicted in FIG. 9. A wet etch is preferably used to undercut the cap layer 20, so that a targeted amount of the carbon nanotube fuse 24 is exposed. The undercut etch preferably removes the cap layer 20 in a controllable manner, without attacking the nanotube fuse 24. This process is used to define the connection areas to the nanotube fuse 24. Typical wet etch chemistries that could perform this process are dilute hydrofluoric acid, dilute phosphoric acid, and cyanide compound etchants, such as are common in the industry.

Figure 10:
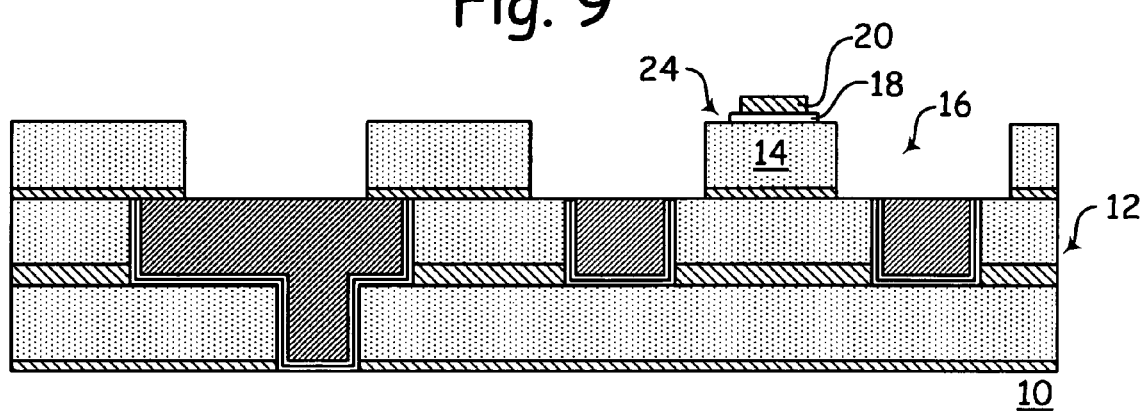
FIG. 10 is a cross sectional view of a cleaned cap layer of the integrated circuit according to the preferred embodiment of the present invention.

In FIG. 10, the photoresist layer 22 has been removed. The resist pattern is preferably removed using a chemical that does not damage or oxidize the exposed nanotube fuse 24. For example, N-Methyl-Pyrolidone is a common resist stripper that will do this. The nanotube fuse 24 is optionally baked dry after this strip operation, to remove any liquids that may persist within the layer after the photostrip operation.

Figure 11:
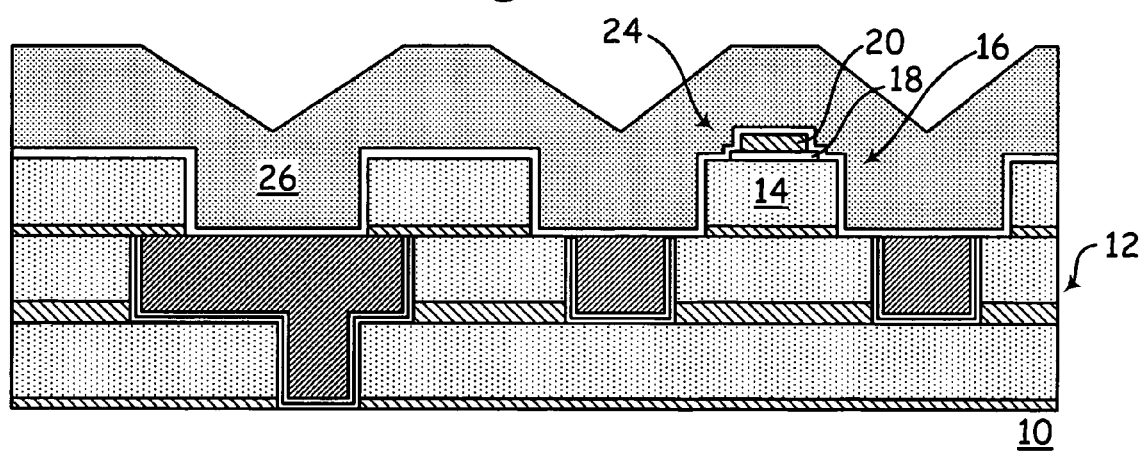
FIG. 11 is a cross sectional view of a conduction layer of the integrated circuit according to the preferred embodiment of the present invention.

As depicted in FIG. 11, a metal bonding pad layer 26 is preferably deposited, using processing as known in the industry. This layer optionally includes a barrier material followed by a thick aluminum alloy. However, in the preferred embodiments, the bonding pad layer 26 is deposited without a barrier layer. The reason for this is that aluminum alloys have a lower melting temperature than typical liner films used in the industry, such as titanium, titanium nitride, tungsten nitride, tantalum, an tantalum nitride.

Figure 12:
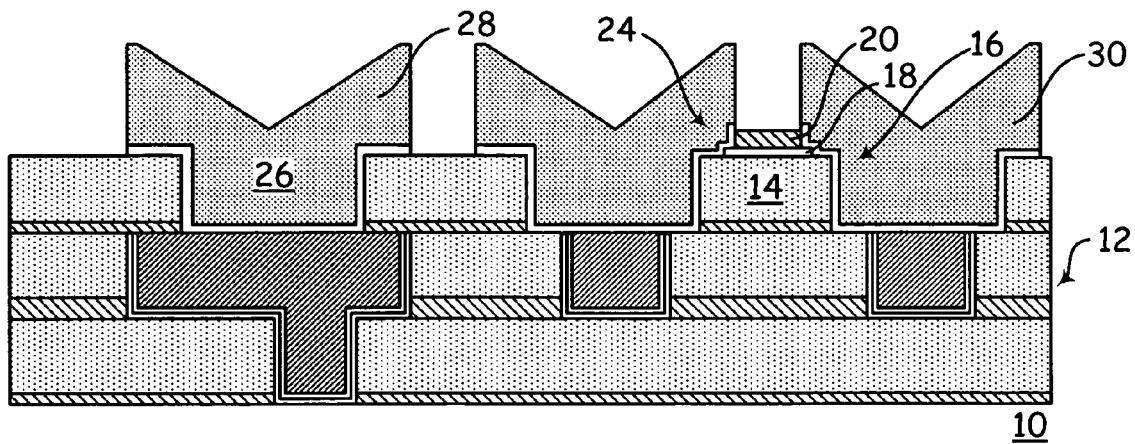
FIG. 12 is a cross sectional view of fuse contacts and bonding pads etched into the conduction layer of the integrated circuit according to the preferred embodiment of the present invention.

FIG. 12 depicts the patterning of the bonding pad layer 26 to form the bonding pads 28 and the fuse contacts 30. The bonding pads 28 and the fuse contacts 30 are preferably patterned and etched according to standard bonding pad formation process steps. The cap layer 20 protects the nanotube fuse 24 during these etching steps.

Figure 13:
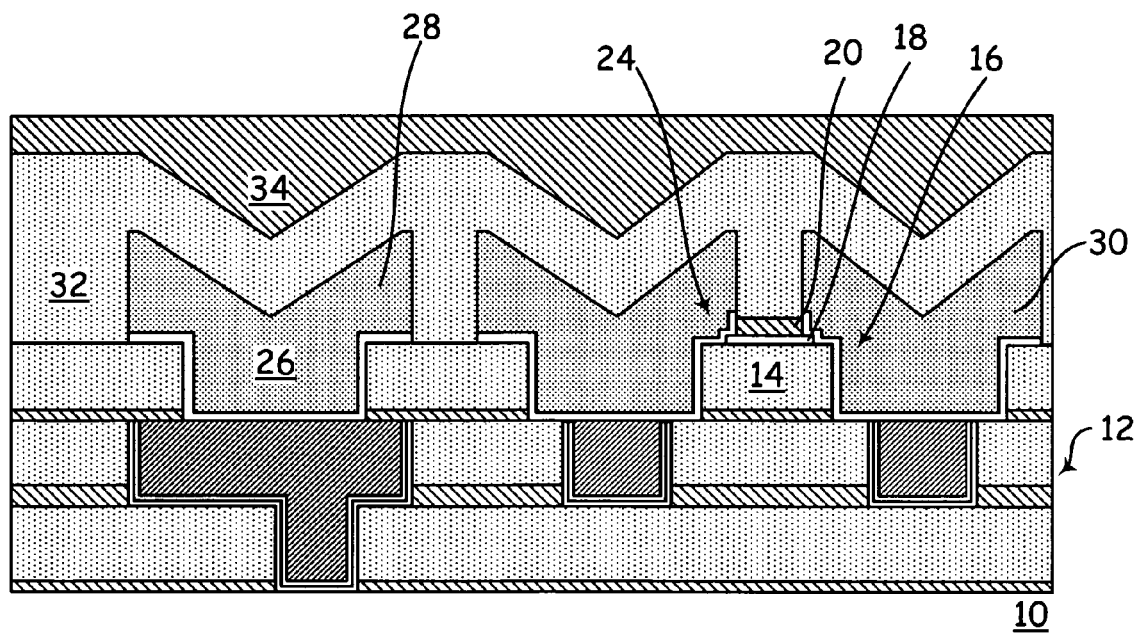
FIG. 13 is a cross sectional view of a passivation layer of the integrated circuit according to the preferred embodiment of the present invention.
Figure 14:
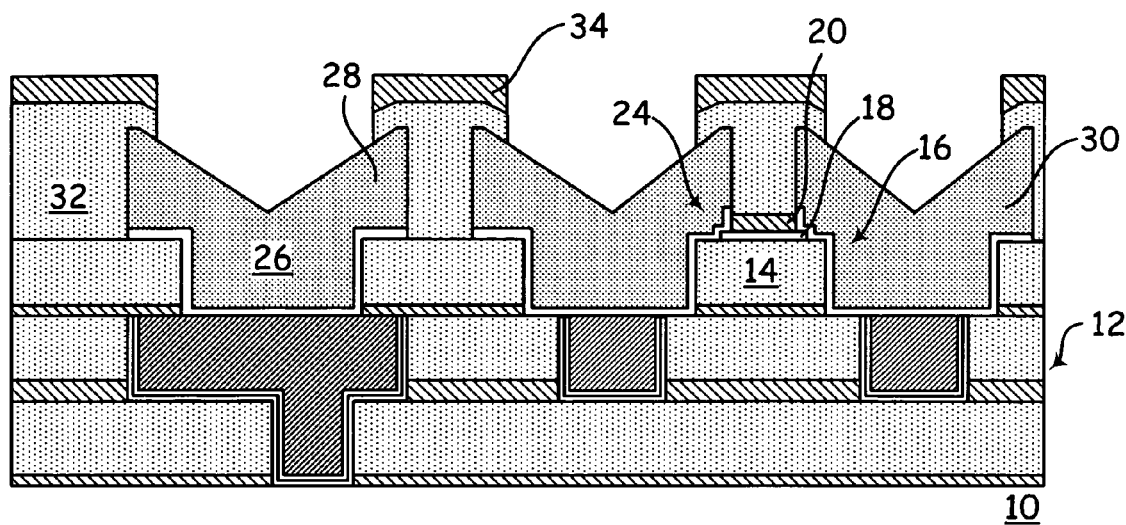
FIG. 14 is a cross sectional view of probing trenches etched in the passivation layer of the integrated circuit according to the preferred embodiment of the present invention.

FIG. 13 depicts passivation layers 32 and 34 that have been formed on the integrated circuit 10. This is preferably an oxide layer 32 followed by a silicon nitride or silicon oxynitride layer 34. The passivation layers 32 and 34 are preferably etched as depicted in FIG. 14, which etches openings to the bonding pads 28 and the fuse contacts 30 at same time. The fuse contacts 30 preferably enable the fuses 24 to be set using a standard prober.

Figure 15:
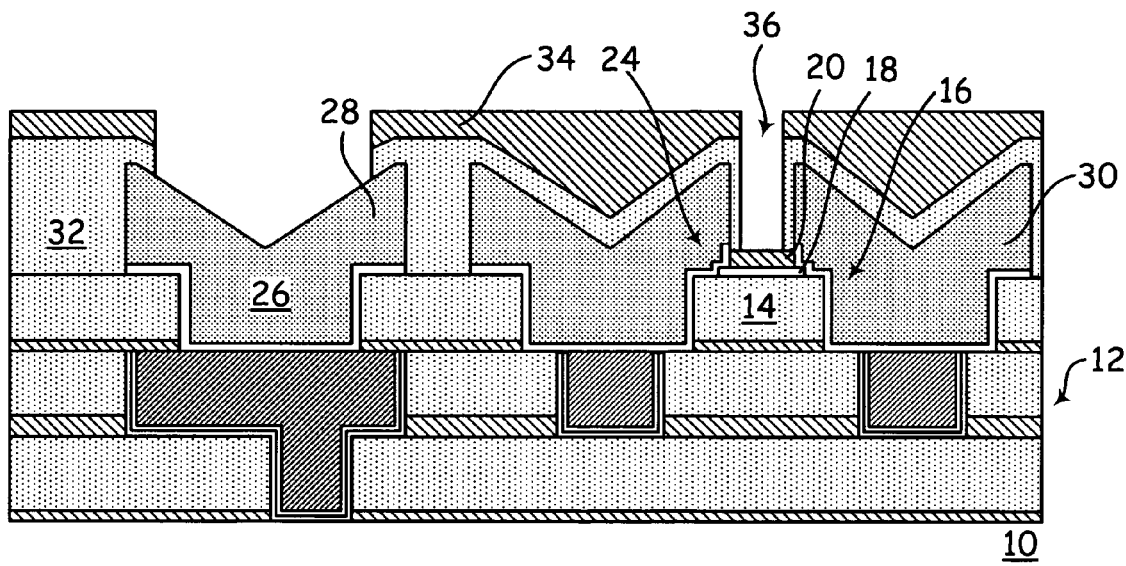
FIG. 15 is a cross sectional view of a trench etched in the passivation to facilitate laser heating of the Carbon Nanotube Fuse according to the preferred embodiment of the present invention.

FIG. 15 depicts an alternate pad etch, which etches an opening 36 over the fuse 24 at same time as the bonding pad 28 opening is created. In this embodiment, the fuse 24 is blown by heating the fuse 24 with an external laser that is directed down through the opening 36 to the fuse 24. Another option is to open the fuse hole 36 over one of the fuse contacts 30, and use the laser to remove the aluminum material of the fuse contact 30 and sever the electrical connection that it makes to the fuse 24. The opening 36 can also be extended all the way down to the nanotube layer 18, in another embodiment, to expose the fuse 24, and an oxygen plasma can be used to destroy the exposed carbon nanotube fuse 24.

Figure 16:
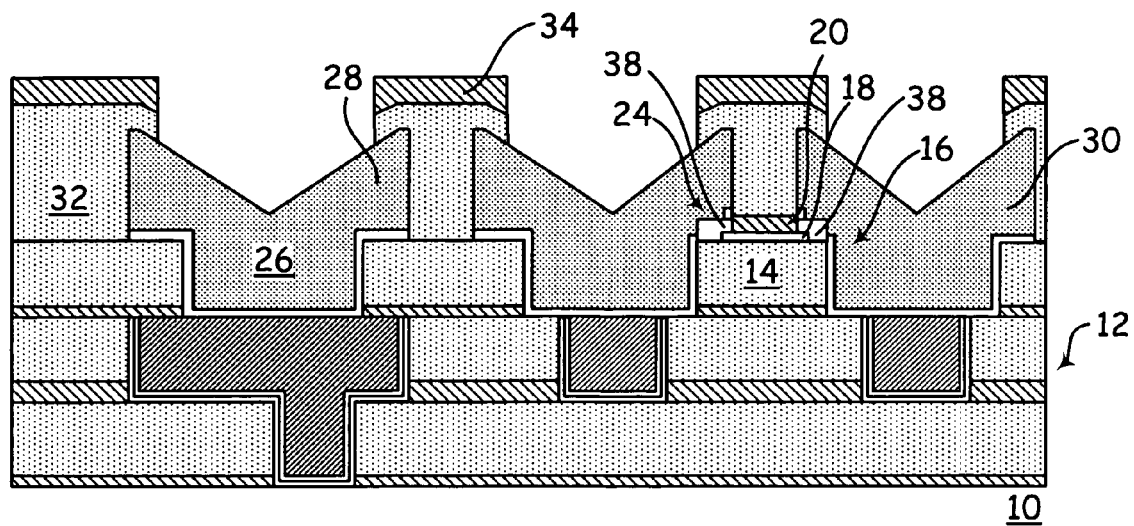
FIG. 16 is a cross sectional view of a blown fuse using the probing trenches of the integrated circuit according to the preferred embodiment of the present invention.

FIG. 16 depicts a blown fuse 24 in the embodiment where the fuse 24 is blown by applying probes through the fuse contact 30 holes. A current is passes from the fuse contacts 30 through the fuse 24, and heats up the carbon nanotube layer 18 of the fuse 24, which ablates the metal contact 30, forming a void around the carbon nanotube layer 18, and thus an electrically open circuit.

Figure 17:
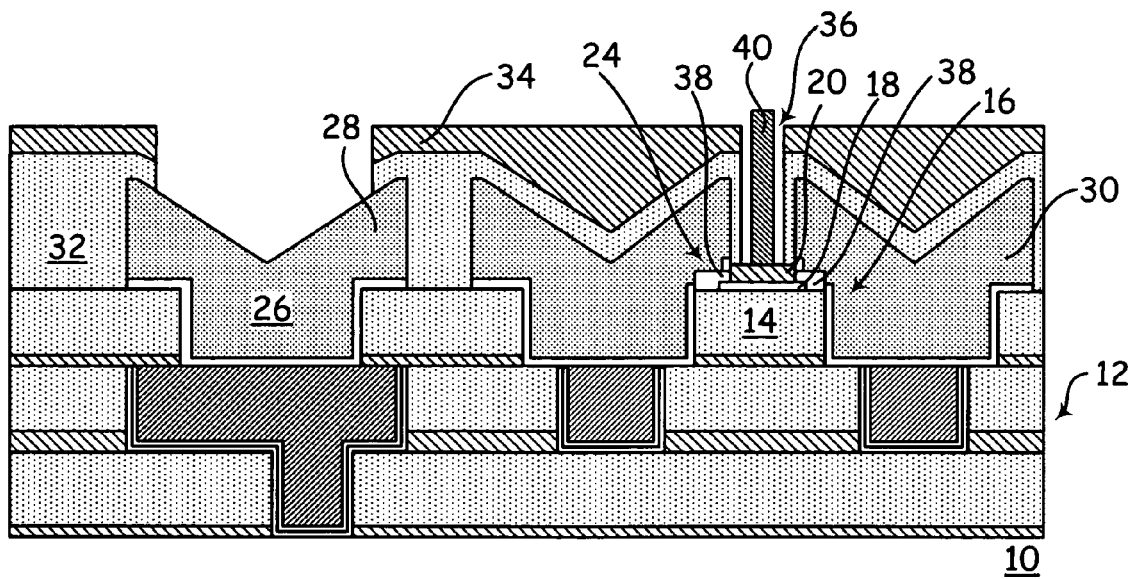
FIG. 17 is a cross sectional view of a blown fuse using the laser heating through the trench of the integrated circuit according to the preferred embodiment of the present invention.

FIG. 17 depicts a blown fuse 24 in the embodiment where the fuse 24 is blown by a laser beam 40 that is applied through the fuse hole 36. The laser 40 heats the carbon nanotube film of the fuse 24, which again ablates the metal contacts 30 on either end of the carbon nanotube layer 18 of the fuse 24, forming voids 38 around the carbon nanotube layer 18, and again resulting in an electrically open circuit.

Some of the features of this invention include the use of a conductive carbon nanotube layer 18 to form the fuse 24. The carbon nanotube layer 18 is preferably in contact with or under-lapping metal contact structures 30. The carbon nanotube fuse 24 is preferably disposed between two metal contacts 30 with dimensions such that one contact 30 or the other is less than a maximum distance at which one contact 30 or the other will readily melt and separate from the fuse 24, and the fuse blowing operation is thereby made relatively insensitive to any critical alignment between the carbon nanotube fuse 24 and the metal contacts 30.

The carbon nanotube layer 18 is placed or patterned before the metal contact layer 26. A protective material like silicon carbide or silicon nitride is placed on top of the carbon nanotube fuse 24 as a cap layer 20 to protect it during patterning of the metal contacts 28 and 30. The protective cap layer 20 is etched in an undercutting process to achieve a targeted amount of carbon nanotube layer 18 to be revealed for the carbon nanotube 24 to metal contact 30. The fuse 24 can alternately be broken with a current pulse so that the connection between the carbon nanotube layer 18 and metal contacts 30 is broken, or with laser heating so that either the connection between the carbon nanotube layer 18 and metal contacts 30 is broken or the carbon nanotube layer 18 itself is broken.

The advantages of this method include fuses 24 that can be created with fewer and less expensive process steps than prior art methods. In addition, the carbon nanotube layer 18 is very thin, so passivation planarity over the integrated circuit 10 is preserved. Further, the carbon nanotube layer 18 can conduct a great deal of heat, so it can melt the contacting metal layers, such as the fuse contacts 30, and sever the electrical continuity of the fuse structure 24. Once connected or disconnected, the carbon nanotube layer 18 is very stable, in a manner that it will not reform a conductive link. The steps and materials used to form the fuse 24 according to the methods described herein are compatible with existing integrated circuit processing equipment and integration schemas. In addition, the prober version of the fuse 24 as depicted in FIGS. 14 and 16 can be formed at any interconnect layer, and need not be formed only at the top most interconnect layer.

The exact sequence and materials used for fabricating the fuse 24 and surrounding structures can be varied to carry out the same basic schema, by using different metal layer materials and different dielectric materials, within the constraints as generally described herein.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a carbon nanotube fuse, the method comprising the steps of:
   depositing a carbon nanotube layer,
   depositing a cap layer directly over the carbon nanotube layer, where the cap layer is formed of a material that has an insufficient amount of oxygen to significantly oxidize the carbon nanotube layer under operating conditions, and is otherwise sufficiently robust to protect the carbon nanotube layer from oxygen and plasmas,
   forming a photoresist layer over the cap layer, and patterning the photoresist layer to define a desired size of fuse,
   etching completely both the cap layer and the carbon nanotube layer without removing the photoresist layer, to define the fuse having two ends in the carbon nanotube layer,
   etching just the cap layer, without removing the photoresist layer, so as to reduce the cap layer by a desired amount at the edges of the cap layer under the photoresist layer, without damaging the carbon nanotube layer,
   removing the photoresist layer, and
   forming electrically conductive contacts on each of the two ends of the fuse.

2. A method of severing an electrically conductive carbon nanotube fuse having a link between two contacts that are disposed on distal ends of the link, the method comprising the step of passing a current between the two contacts and through the link, where the current is sufficient to create a Joule heating effect within the link sufficient to cause at least one of the two contacts to ablate and sever electrical continuity with the end of the link, without the link structurally changing.

3. A carbon nanotube fuse comprising:
   a carbon nanotube layer,
   a cap layer formed directly over the carbon nanotube layer, where the cap layer is formed of a material that has an insufficient amount of oxygen to significantly oxidize the carbon nanotube layer under operating conditions, and is otherwise sufficiently robust to protect the carbon nanotube layer from oxygen and plasmas, the cap layer formed at a smaller size than the carbon nanotube layer, to expose a contact area at distal ends of the carbon nanotube layer, and
   electrically conductive contacts disposed on each of the two distal ends of the carbon nanotube layer and in electrical continuity with the carbon nanotube layer through the contact area,
   where the contact area is of a size sufficient for at least one of the contacts to ablate from the carbon nanotube layer upon application of a current that causes a Joule heating effect in the carbon nanotube layer.

* * * * *